United States Patent [19]

Berger

[11] Patent Number: 4,617,595
[45] Date of Patent: Oct. 14, 1986

[54] PROCESS AND APPARATUS FOR ANALYZING A PHOTOSENSITIVE DEVICE HAVING AN INTERLINE-TRANSFER STRUCTURE

[75] Inventor: Jean-Luc Berger, Grenoble, France
[73] Assignee: Thomson-CSF, Paris, France
[21] Appl. No.: 660,443
[22] Filed: Oct. 12, 1984

[30] Foreign Application Priority Data

Oct. 21, 1983 [FR] France ............... 83 16792

[51] Int. Cl.[4] ............................................. H04N 3/14
[52] U.S. Cl. .................................................. 358/213
[58] Field of Search ............ 358/213, 212, 44, 41, 358/211; 357/24 LR

[56] References Cited

U.S. PATENT DOCUMENTS 4,553,167 11/1985 Kinoshita ..................... 358/212

FOREIGN PATENT DOCUMENTS 2481553 10/1981 France ........................... 358/213
2504334 10/1982 France ........................... 358/213

OTHER PUBLICATIONS

Electronic Design, vol. 29, No. 16, aout 1981, pp. 183-190, Waseca, MN (USA); A. P. King et al.:"Charge-Coupled Devices Tackle TV Imaging."

Primary Examiner—Gene Z. Rubinson
Assistant Examiner—Stephen Brinich
Attorney, Agent, or Firm—Roland Plottel

[57] ABSTRACT

In a light sensitive device having an interline transfer structure comprising a photosensitive matrix of N columns of M photosensitive points each photosensitive point of a single column is connected to a stage of a charge transfer shift register that transfers of the charges of the photosensitive points towards reading register perpendicular to the shift registers, the transfer for signal charges $Q_S$ of the photosensitive points towards the corresponding stages of the shift registers being realized by superimposing a drive charge on the signal charges at the level of the photosensitive points at least sufficient for passing into the high inversion range at the beginning of the transfer. The instant process and apparatus are adapted to be used in the field of solid-state imagery.

7 Claims, 6 Drawing Figures

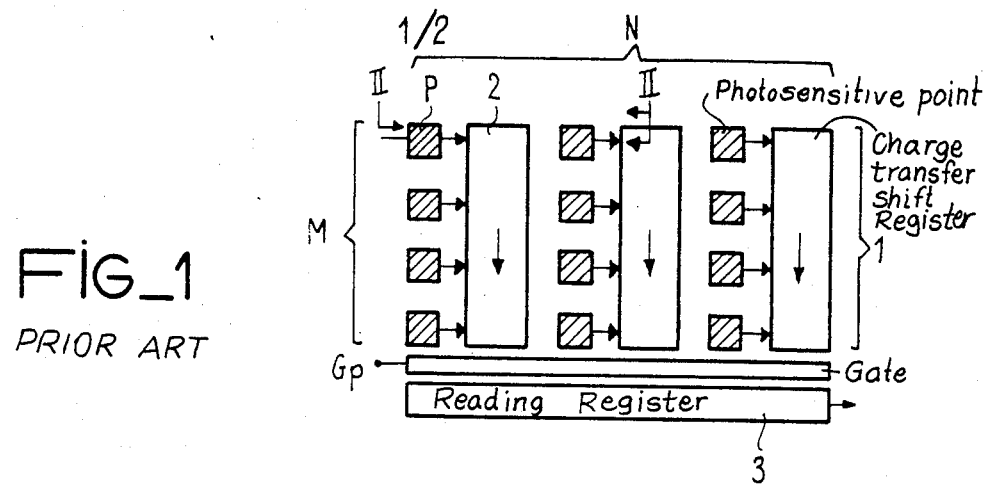
FIG_1 PRIOR ART
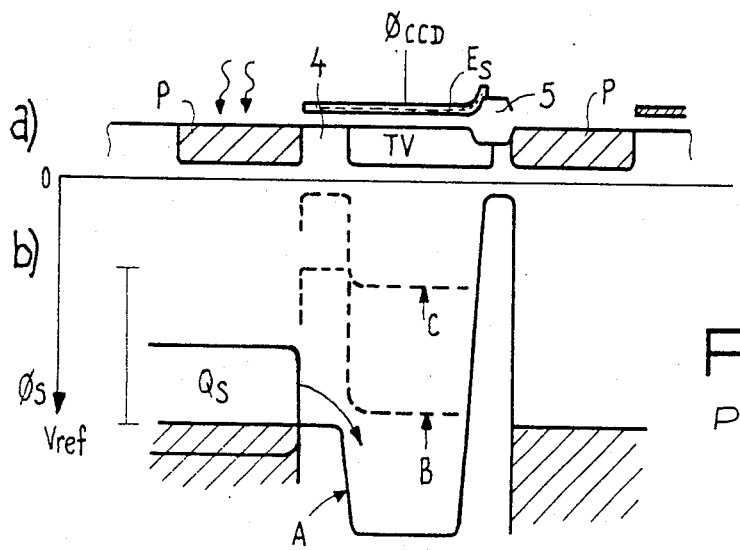
FIG_2 PRIOR ART
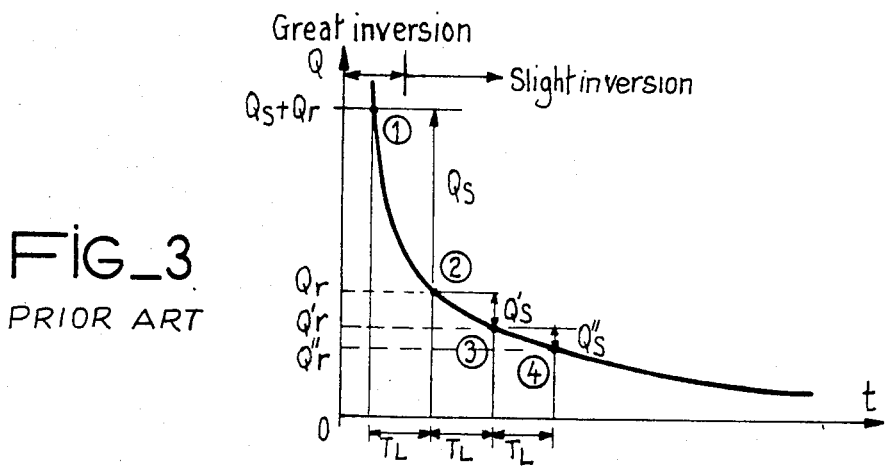
FIG_3 PRIOR ART

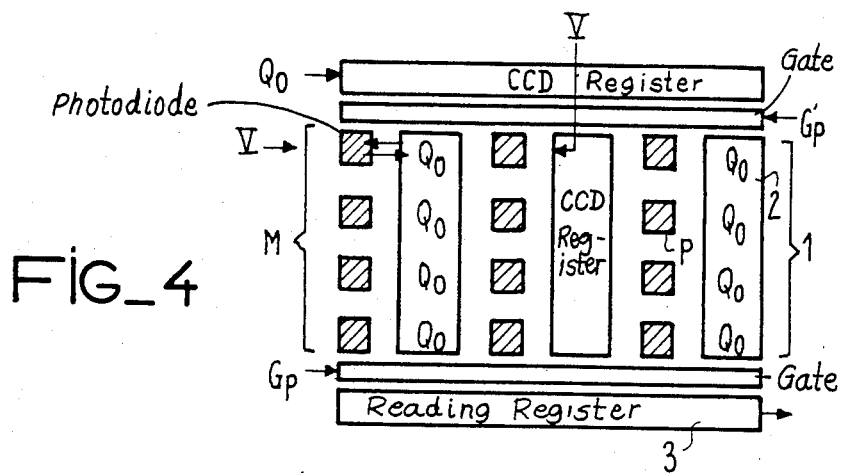
FIG_4
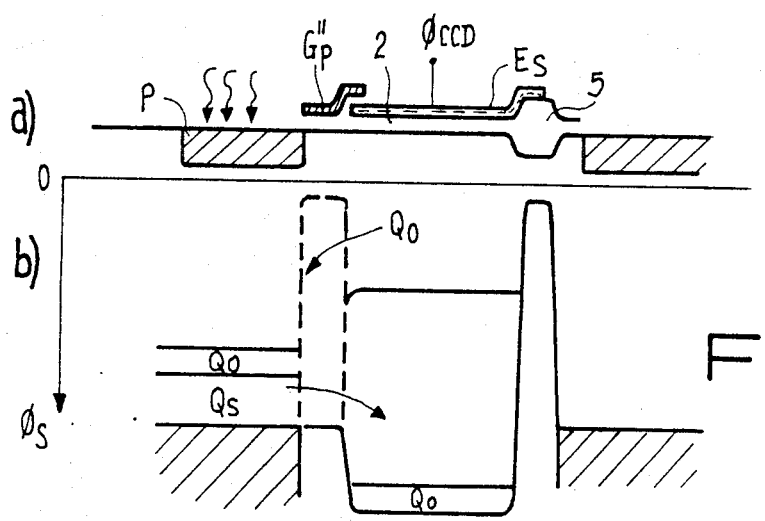
FIG_5
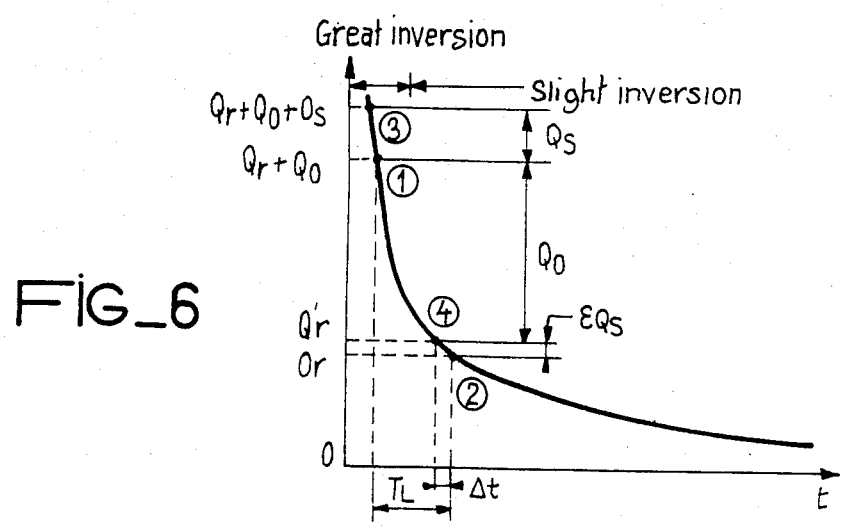
FIG_6

PROCESS AND APPARATUS FOR ANALYZING A PHOTOSENSITIVE DEVICE HAVING AN INTERLINE-TRANSFER STRUCTURE

BACKGROUND OF THE INVENTION

1. Field of the Invention

The present invention concerns a process for analyzing a light sensitive or photosensitive device having an interline-transfer structure. It also concerns an apparatus for carrying out said process.

2. Description of the Prior Art

Photosensitive devices having an interline-transfer structure are well known to those skilled in the art. In particular, they are described in the publication of CH. SEQUIN and N. F. TOMPSETT entitled "Charge Transfer Devices", pages 156 to 166.

As shown in FIGS. 1 and 2(a) appended hereto, a photosensitive device having an interline-transfer structure is essentially constituted by a photosensitive matrix 1 comprising N column of M photosensitive points P, analog shift registers 2 provided between any two adjacent columns of M photosensitive points as well as a reading register 3.

In a more detailed manner, the photosensitive points P of a column are connected to M stages of an analog register 2, preferably constituted by a charge transfer register of the CCD type, having parallel inputs and series output, through the intermediary of a potential barrier various means may be utilized to realize this potential barrier. Thus, as represented on FIG. 2(a), the CCD register 2 is of the volume transfer type, i.e. the transfer channel of the register 2 has received an implantation of impurities of the type opposite that of the substrate in order to realize a bulk channel TV, for example, an N type impurities implantation for a P type silicon substrate. The transfer channel TV is separated from the photosensitive points P constituted by photodiodes in the embodiment represented, by a surface transfer zone 4, namely a zone free from doping, the channel and the said surface transfer zone 4 both being convered with storage electrodes ES of the CCD register. For this reason a potential barrier, the level of which varies in function of the voltage applied to electrodes ES, is obtained between photodiodes P and registers 2. The potential barrier can also be realized through the use of a supplementary electrode provided between the photodiodes P and register 2 which, in this case, can be of the surface transfer type or of the volume transfer type.

The output of the various registers 2 is sent, through the intermediary of passage gate $G_p$ into a reading register 3 positioned perpendicular to registers 2. Register 3 is generally constituted by an analog shift register that supplies data received in parallel in series mode. This register is preferably a CCD type transfer register.

Furthermore, the different columns are separated from one another by an insulating barrier 5 realized by an oxide overthickness in the embodiment represented in FIG. 2(a).

The different image integration operations at the level of the photosensitive matrix 1, then of the reading of the charges corresponding to this image in order to obtain at the output of register 3 the video analysis signal of the optical image received on the photosensitive zone, are analyzed as follows:

During line scanning time, the duration of which is generally 20 milliseconds, signal charges $Q_S$ are integrated in photosensitive points P. Thereafter, signal charges $Q_S$ stored in the different photosensitive points are transferred to corresponding CCD registers. To this end a high potential $\phi_{CCD}$ is applied to electrodes ES of register 2, so as to obtain the potential curve referenced A in FIG. 2(b), which eliminates the potential barrier between the photosensitive points P and the corresponding registers 2. Once the transfer is complete, control phases $\phi_{CCD}$ constituted by square-wave voltage, are applied to the registers 2 providing successively potential curves referenced B and C. The potential barrier is thus recreated between the photosensitive points and registers 2, which allows a fresh integration of signal charges in the photodiodes. During this time, registers 2 effect the shift of the charges contained in ach stage towards read-register 3 that transfers the said charges towards a reading-stage between any two successive transfers issuing from the register 2.

However, with this mode of operation, an important remanence phenomenon is observed, due to the fact that the transfer of the signal charges from the photodiodes towards registers 2 terminates in low inversion conditions as will be explained in detail with reference to FIG. 3.

FIG. 3 is a curve illustrating the transfer of the signal charge $Q_S$ stored in a photodiode P towards the corresponding CCD register. It demonstrates the evolution of this charge as a function of time. This curve comprises a substantially vertical portion corresponding to a transfer in high inversion conditions, then a bend and finally a substanially horizontal portion corresponding to a transfer in low inversion conditions.

It is presumed that a quantity of charges $Q_S$ has been integrated in a photodiode P. The characteristic Q(t) of FIG. 3 is thus repeated at point ①, due to the residual charge $Q_r$ remaining in the photodiode. Since the capacity of the photodiode is very small, point ① is positioned in the high inversion zone. After reading-time TL the charge $Q_S$ was transferred to register ②. The operating point of the photodiode is present at point ② of the curve, i.e. in the bend of the curve, and the photodiode only contains the residual charge $Q_r$. In this case, the transfer of the signal charge $Q_S$ has been effective, since it is carried out in the high inversion range. In the following scanning line, if the luminous object was not displaced, a fresh charge $Q_S$ has been integrated in the photodiode. It is again transferred and the charge of the photodiode thus evolves between two equilibrium points ① and ②.

However, if the luminous object is displaced and if the photodiode involved does not receive any more luminous data, at the reading of the following frame realized in time TL, the charge of the photodiode evolves from point ② towards point ③. This consequently results in the reading of interference data $Q'_S$. If the absence of lighting continues, an evolution from point ③ towards point ④ is observed with the reading of an interference charge $Q''_S$ and so on until the low inversion current is set off by the obscurity current of the photodiode. The reading of the charges $Q'_S, Q''_S$ : . . thus constitutes the remanence phenomenon. This phenomenon is particularly prejudicial at low light level, since in this case the charge $Q'_S, Q''_S$ . . . have an amplitude as high as the signal.

The present invention is thus aimed at overcoming this drawback by proposing an analysis process of an interlaced scanning type photosensitive device that allows to reduce considerably the remanence phenomenon.

SUMMARY OF THE INVENTION

The object of the present invention is a process for analyzing a light sensitive device having an interline transfer structure, this device comprising a photosensitive matrix with N columns of M photosensitive points, each photosensitive point of any given column being connected to a stage of a charge transfer shift register which ensures the transfer of the charges of the photosensitive point towards a reading-register perpendicular to the shift register, and wherein the transfer of signal charges of said photosensitive points towards the corresponding stages of the shift registers is obtained by superimposing on the signal charges at the level of the photosensitive points a drive charge at least sufficient for passing into the high inversion range at the beginning of the transfer.

BRIEF DESCRIPTION OF THE DRAWINGS

Other features, objects and advantages of the invention will appear from reading the following description of an embodiment, given by way of non-limitative example, with reference to the appended drawings in which:

FIG. 1 is a plane view from above of a photosensitive device having an interline transfer structure according to the prior art;

FIGS. 2(a) and 2(b) are respectively a sectional view along II—II of FIG. 1 and a diagram explaining its operation;

FIG. 3 is a curve showing how the transfer of signal charges of the photodiodes towards the corresponding analog shift registers is carried out;

FIG. 4 is a plane view from above of a photosensitive device having an interline transfer structure according to the present invention;

FIGS. 5(a) and 5(b) are respectively a sectional view along V—V of FIG. 4 and a diagram explaining its operation;

FIG. 6 is a curve showing how the signal charges tranfer of the photodiodes towards the corresponding analog shift registers is carried out.

DETAILED DESCRIPTION OF THE PREFERRED EMBODIMENT

In the different figures, identical references designate similar elements, but for enhanced clarity, the dimensions and proportions of the various elements have not been respected.

In the introduction to the present disclosure, it has been demonstrated that the process for analyzing a light sensitive device having an interline transfer structure such as conventionally used presents the drawbacks of leading to high remanence phenomenon due to the interference charges produced during low lighting phases.

According to the present invention, this problem is overcome by using a drive charge $Q_O$ which is superimposed on the signal charge $Q_S$ integrated in the photodiodes. FIG. 4 represents a plane view of a light sensitive device having an interline transfer structure that has been modified in order to allow injection of this drive charge $Q_O$ on the photodiode according to the process of the present invention.

As represented in FIG. 4, an analog register 6, preferably a CCD type charge transfer register, is placed parallel to the reading register but at the other end of the CCD registers. This register 6, with series input and parallel outputs, allows to inject the drive charge $Q_O$ towards the CCD registers 2 through a passage gate $G'_p$ as will be explained in detail herein-below.

Furthermore, as represented in FIG. 5(a) a passage gate $G''_p$ is provided between the photodiodes of a single column and the corresponding CCD register 2. In this case CCD register 2 can be of the surface transfer type or of the volume transfer type.

According to the present invention, the charge $Q_O$ is injected into the CCD register 6 during reading time of the reading register 3. Thereafter, during the transfer of the signal charges of the analog registers 2 towards the reading register 3, passage gate $G'_p$ is brought to a high level and charges $Q_O$ present at the level of each output of the CCD registers 6 are transferred from this register towards the first stage of the registers 2.

Once the reading of the previously integrated signal charges has been carried out, gate $G''_p$ is brought to high level as represented in FIG. 5(b) while the phase $\phi_{CCD}$ applied to register 2 is at the low level. Due to this fact, charge $Q_O$ is transferred onto the photodiode where it is superimposed on signal charge $Q_S$ stored in this photodiode. Thereafter, the phase of shift register 2 is brought to high level, which provokes the transfer of the combined drive charge and signal charge $(Q_O+Q_S)$ to CCD register 2.

The gate $G''_p$ is thus brought back to the low level and a fresh integration of charges occurs during reading time of charges $(Q_O+Q_S)$.

It will now be explained, with reference to FIG. 6 how the utilization of a drive charge $Q_O$ allows the remanence effect to be reduced.

Similarly to the transfer curve of FIG. 3, the transfer curve represented in FIG. 6 comprises a vertical portion corresponding to a transfer in the high inversion range, a curved portion and a horizontal portion corresponding to a transfer in the low inversion. When no luminous charge is integrated in the photodiode, the charge of the photodiode varies during each transfer between $Q_r+Q_O$ and $Q_r$, i.e. between points ① and ② on the curve of FIG. 6, constant charge $Q_O$ being transferred at each frame.

If the photodiode integrates a charge $Q_S$, at the beginning of the transfer, the charge $Q_S+Q_O+Q_r$ is stored in the photodiode. This charge corresponds to point ③ on the curve of FIG. 6. After a transfer time TL, the charge is present at point ④ of the curve, point which is slightly different from point ② obtained in the absence of lighting. This point ④ corresponds to a residual charge $Q'_r$.

In fact, the error $(Q'_r-Q_r)=\epsilon Q_S$ which is read as remanence at the following frame is proportional to the ratio of the slopes between points ② and ①. Indeed, $\epsilon Q_S$ can also be expressed as a function of $Q'(T_2)$ which is the slope of the curve at point ②.

$$\epsilon Q_S = \Delta T \cdot Q'(T_2) \tag{1}$$

where $\Delta T$ is the projection of segment 4-2 on the time axis.

The projection of the segment 1-3 on the time axis also equals $\Delta T$, thereby producing the following relation taking $\Delta T$ into account:

$$Q_S = \Delta T \cdot Q'(T_1) \ldots \tag{2}$$

where $Q'(T_1)$ is the slope of the curve at point 4.

The efficiency of transfer is thus expressed by using relations (1) and (2) as a function of the ratio of the slopes of the curves at points ② and ①.

$$\epsilon = Q'(T_2)/Q'(T_1)$$

Consequently, if the drive charge $Q_O$ is sufficient to reach the high inversion level, term $\epsilon$ can be about $10^{-3}$. Therefore, the remanence effect is considerably reduced.

Similarly, the minimum amplitude of the drive charge $Q_O$ must be so selected that it allows to pass to high inversion conditions at the beginning of the transfer from the photodiodes towards registers 2, even if no signal charge is to be transferred. However, since the capacity of the photodiodes is small, the quantity of charges $Q_O$ can be relatively low. Specifically, the quantity of charges $Q_O$ can be selected so as to be comprised between (QS max)/30 and (QS max)/10.

It is evident from those skilled in the art that the device of FIG. 4 represents a way of realizing the injection of the drive charges $Q_O$ according to the process of the present invention, but that this injection can be realized through the use of other devices than that of FIG. 4.

Therefore, with the process according to the present invention, it is possible to ensure effective transfer of charges from photodiodes towards CCD registers 2 by reducing the remanence phenomenon as efficiently as possible.

What is claimed is:

1. A process for analyzing a light sensitive device having an interline transfer structure, this device comprising a photosensitive matrix of N columns of M photosensitive points receiving signal charges, each photosensitive point of a single column being connected to a stage of a charge transfer shift register that transfers signal charges from the photosensitive points towards a reading register, perpendicular to the shift registers, said process comprising the following steps:

superimposing on the signal charges at the photosensitive points drive charge Qo at least sufficient to place the total charge at each photosensitive point in the high inversion range at the beginning of the transfers, and
   transferring the signal charges plus the drive charge from the photosensitive points towards the corresponding stages of the shift registers.

2. A process for analyzing a light sensitive device having an interline transfer structure, this device comprising a photosensitive matrix of N columns of M photosensitive points receiving signal charges, each photosensitive point of a single column being connected to a stage of a charge transfer shift register that transfers signal charges from the photosensitive points towards a reading register, perpendicular to the shift registers, said process comprising the following steps:

injecting a drive charge into each stage of the shift registers, during a preceding reading time;
   transferring the drive charge from the shift registers to the photosensitive points where said charge is superimposed on the signal charges;
   transferring charges constituted by the signal charge plus the drive charge from the photosensitive points to the shift registers to be read in a conventional manner.

3. A device comprising a photosensitive matrix of N columns of M photodiodes receiving signal charges, each photosensitive point of a single column being connected to a stage of a charge transfer shift register that transfers signal charges from the photosensitive points towards a reading register perpendicular to the shift registers, means for injecting drive charges $Q_O$ into the shift register and means for transferring the drive charge $Q_O$ from the registers to the photodiodes at the end of an integration time period.

4. A process according to claim 1, wherein the drive charge $Q_O$ has a value lowr than (QS max)/10, $Q_S$ max corresponding to a maximum value of the signal charges.

5. A process according to claim 2, wherein the drive charge $Q_O$ has a value lower than (QS max)/10, $Q_S$ max corresponding to a maximal value of the signal charges.

6. An apparatus according to claim 3, wherein the means for injecting the drive charge into the shift registers is constituted by an analog shift register having a series input and parallel outputs, each output of which is connected to the input of a shift register through the intermediary of a passage gate.

7. An apparatus according to claim 3, wherein the means for transferring the drive charge $Q_O$ of a register to the corresponding photodiodes is constituted by a passage gate brought to a high level during the time of transfer of the charges of the register toward the photodiodes.

* * * * *